United States Patent [19]

Treitinger et al.

[11] Patent Number: 5,047,823
[45] Date of Patent: Sep. 10, 1991

[54] CIRCUIT STRUCTURE HAVING A LATERAL BIPOLAR TRANSISTOR AND ITS METHOD OF MANUFACTURE

[75] Inventors: Ludwig Treitinger; Emmerich Bertagnolli, both of Munich, Fed. Rep. of Germany

[73] Assignee: Siemens Aktiengesellschaft, Munich, Fed. Rep. of Germany

[21] Appl. No.: 509,308

[22] Filed: Apr. 16, 1990

[30] Foreign Application Priority Data

May 11, 1989 [EP] European Pat. Off. ........ 89108511.0

[51] Int. Cl.⁵ ......................................... H01L 21/265
[52] U.S. Cl. ...................................... 357/34; 357/35; 437/32; 437/33
[58] Field of Search ...................... 357/34, 35; 437/32, 437/31

[56] References Cited

U.S. PATENT DOCUMENTS

| | | | |
|---|---|---|---|
| 4,581,319 | 4/1986 | Wieder et al. | 437/31 |
| 4,737,472 | 4/1988 | Schaber et al. | 357/34 |
| 4,755,476 | 7/1988 | Böhm et al. | 437/31 |
| 4,818,713 | 4/1989 | Feygenson | 437/33 |
| 4,889,823 | 12/1989 | Bertagnolli et al. | 357/34 |
| 4,916,083 | 4/1990 | Morkowski et al. | 437/31 |
| 4,965,872 | 10/1990 | Vasuder | 357/35 |
| 4,981,806 | 1/1991 | Maas et al. | 437/32 |

FOREIGN PATENT DOCUMENTS

| | | |
|---|---|---|
| 0138563 | 4/1985 | European Pat. Off. . |
| 63-69268 | 3/1988 | Japan ........ 437/31 |
| 2-40922 | 2/1990 | Japan ........ 357/35 |
| 2198285 | 6/1988 | United Kingdom . |

OTHER PUBLICATIONS

Berger, "Method of Producing a Lateral Transistor", IBM TDB, vol. 23, No. 3, Aug./80, pp. 1089-1090.
Arimoto, Y. et al., "Pulse-Field-Assisted Bonding for SOI Devices," 46th Dev. Res. Conf., 1088, Boulder, Colo., p. IA-6.
Werner, W. M. et al., "Modern Bipolar Technology for Gate Array and Memory Applications," Siemens Forsch-u. Entwick, vol. 17, No. 5, 1988, pp. 221-226.
Haisma, J., "SOI Technologies: Their Past, Present and Future", Journal de Physique, vol. 49, C4, Supp. No. 9, 1988, pp. C4-3-C4-12.

*Primary Examiner*—Andrew J. James
*Assistant Examiner*—Viet Q. Nguyen
*Attorney, Agent, or Firm*—Hill, Van Santen, Steadman & Simpson

[57] ABSTRACT

A circuit structure contains at least one bipolar transistor whose emitter is fashioned as a part of a doped silicon layer grown on a substrate. The doped silicon layer comprises a sidewall extending parallel to its surface normal, the sidewall being covered with a doped silicon structure in contact with the silicon substrate and forms the base of the bipolar transistor. The bipolar transistor comprises a self-aligned, effective emitter with a 50-500 nm.

26 Claims, 3 Drawing Sheets

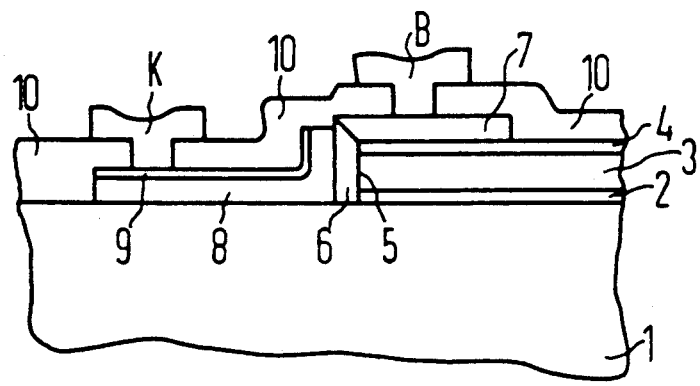
FIG 1
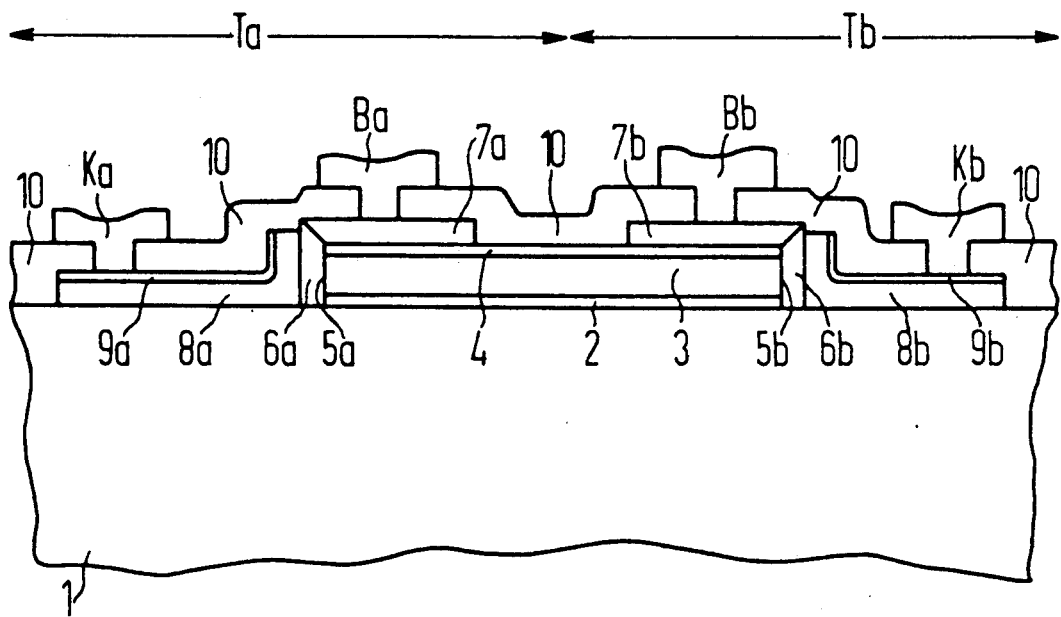
FIG 2
FIG 3
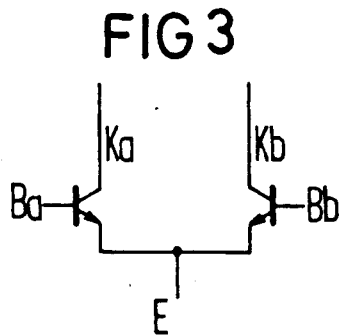
FIG 4
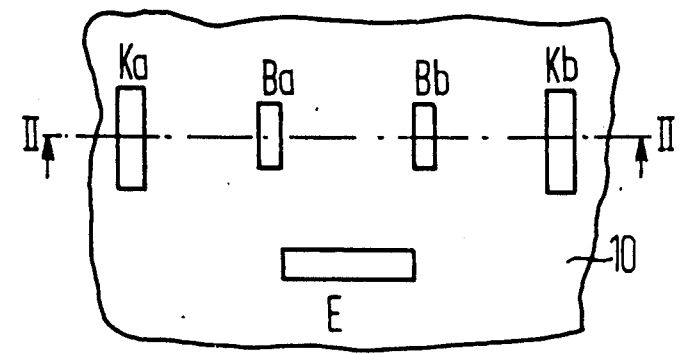

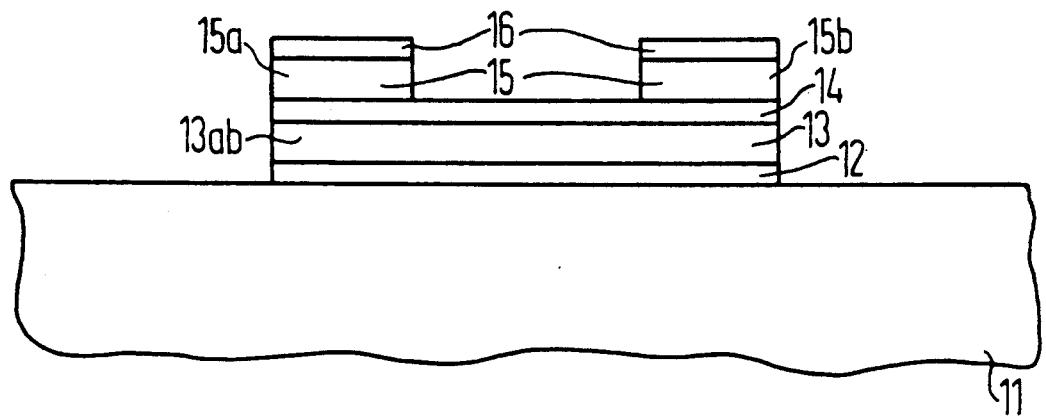
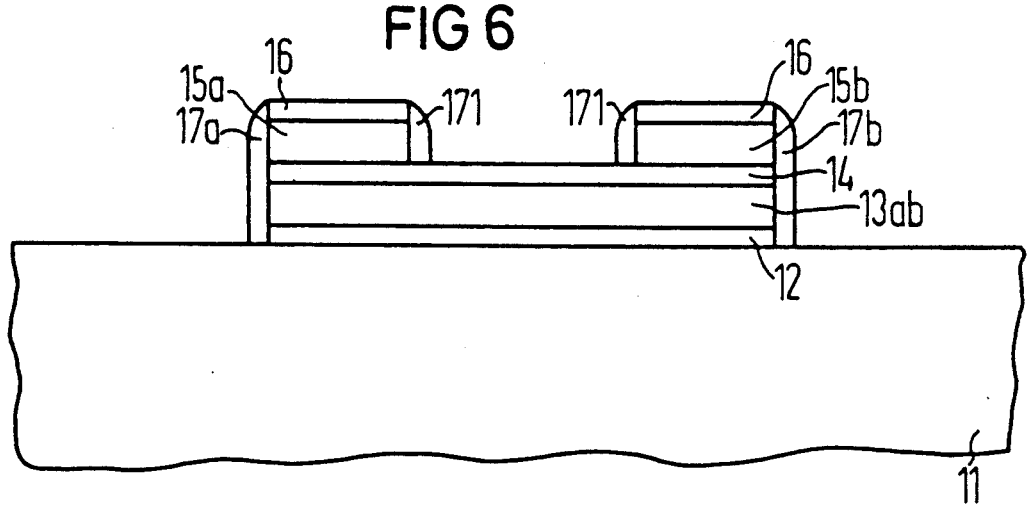
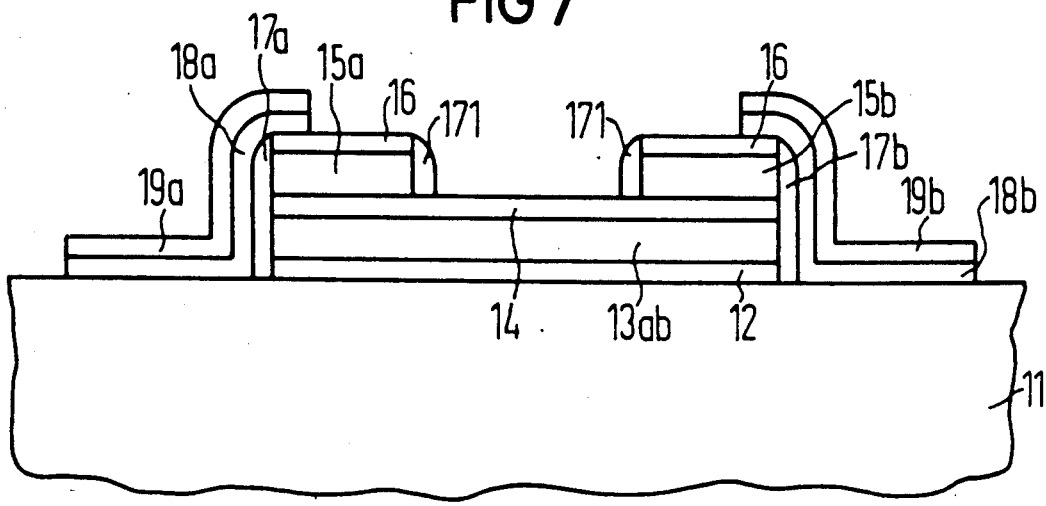

CIRCUIT STRUCTURE HAVING A LATERAL BIPOLAR TRANSISTOR AND ITS METHOD OF MANUFACTURE

BACKGROUND OF THE INVENTION

1. Field of the Invention

The present invention relates to bipolar transistors, and is particularly concerned with bipolar transistors in fast integrated circuits.

2. Description of the Prior Art

Silicon bipolar transistors are required for fast integrated circuits, as needed in data technology, consumer electronics and communications technology.

Further developments of bipolar transistors have been toward higher speeds, given higher packing density. In order to achieve higher integration, the demand of reducing the space requirement is made of the individual transistor.

What is referred to as the polysilicon self-aligned (PSA) transistor is now universally standard, this being described, for example, by W.M. Werner, et al in the "Modern Bipolar Technology for Gate Array and Memory Applications", Siemens Forschungs-und Entwicklungsbericht, Vol. 17, No. 5, 1988, pp. 221-226 For manufacturing the PSA transistor, a polycrystalline layer is applied onto a silicon substrate. The polycrystalline layer is doped with a material of a first conductivity type. A first oxide layer is deposited thereon. A window structure is produced in this double layer by etching down to the substrate surface, the active base being formed by implantation through the window structure. The sidewalls of the window are covered with oxide spacers. A second polycrystalline layer that is of a material of the opposite conductivity type with reference to the first polysilicon layer is then deposited onto the oxide layer, onto the sidewall spacers and onto the exposed surface of the substrate. The emitter is formed self-aligned relative to the active base by out-diffusion from the second polycrystalline layer into the substrate. The definition of the dimensions of the window and, therefore, of the dimensions of the emitter width that derives occurs by photolithography in the PSA transistor. Given small emitter widths, a deviation from reference dimensions is extremely probable. In a one-micrometer lithography, the effective emitter contact width amounts to about 0.6 $\mu$m since the sidewall spacers have a finite extent. Given a tolerance in the lithography of at least $\pm$ 0.1 $\mu$m per edge, one must therefore count on a tolerance of about 30% of the effective emitter width. The tolerance therefore becomes intolerable for smaller emitter widths.

Fluctuations in the size of the emitter area have an influence on the current density in the transistor. This enters in the optimization of the circuits with respect to currents, voltage drops, speed and dissipated power. Fluctuations on the order of magnitude of 30% are not acceptable for many circuits.

Pairs of transistors in which the transistors have identical doping profiles are often employed in differential amplifiers. For such pairs of transistors, the offset voltage, i.e. the control voltage with which the inputs of a differential amplifier must be occupied so that the output currents become of identical size, is dependent only on the differences of the effective emitter areas. For offset values of approximately 1mV. the emitter areas may differ by a maximum of about 4%.

The European Patent Application 0 239 825 A1 discloses a bipolar transistor wherein the effective emitter widths are defined in self-aligned fashion, i.e. not via photolithography. A conductive layer is deposited onto the surface of a substrate that has a step-shaped elevation. The deposition occurs such that the edge of the step-shaped elevation is well covered. The layer is doped. An etching residue is produced at the vertical sidewall of the step-shaped elevation by anisotropic re-etching of the layer. The emitter is formed by out-diffusion from the etching residue into the substrate. The etching residue forms a part of the emitter terminal region. The effective emitter area in this transistor is defined by the common area of the substrate and of the etching residue. The extent of this effective emitter area is therefore dependent on the thickness of the conductive layer that is deposited and on the parameters used in the etching process. The tolerance of the effective emitter area is reduced to about 10% in this transistor.

SUMMARY OF THE INVENTION

The object of the present invention is to provide a circuit structure having a bipolar transistor and of providing a method of manufacturing such a circuit structure wherein a further reduction of the scatter of the emitter area dimensions is achieved and wherein emitter widths below 0.5 $\mu$m can be accurately set.

The above object is achieved, according to the present invention, by a circuit structure having at least one bipolar transistor comprising the following features:

a) the emitter of the bipolar transistor is fashioned as part of a doped silicon layer grown on a substrate that has sidewalls that are parallel to its surface normal; and b) the base of the bipolar transistor is fashioned as a doped silicon structure that is arranged at the surface of the substrate and that covers the sidewalls of the silicon layer.

The effective emitter area in this bipolar transistor is the sidewall of the silicon layer covered with the silicon structure. The expanse of the effective emitter area is therefore defined by the thickness of the silicon layer. The deposition thickness of the silicon layer can be excellently controlled via the crystal growth process. The silicon layer is preferably deposited to a thickness of between 50 nm and 200 nm.

It lies within the scope of the invention and is a feature of the transistor constructed in accordance with the invention that a first insulation layer is provided between the substrate and the doped silicon layer. A good control of the current density in the transistor is thereby established.

The provision of a second insulating layer above the doped silicon layer makes it possible to undertake the contacting of the base above the silicon layer. The base that is composed of the doped silicon structure that covers the sidewall of the silicon layer is contacted by a base terminal region composed of a material having good electrical conductivity. The base terminal region is arranged on the second insulating layer and is electrically connected to the silicon structure that forms the base. A low-impedance contacting of the base is assured in this manner. The base terminal region is composed, for example, of a metal silicide.

It also lies within the scope of the invention and is a particular feature of a transistor constructed in accordance with the invention to arrange the collector as a further doped silicon structure on the surface of the substrate at the side of the base facing away from the emitter. Fast switching times are achieved by this linear arrangement of emitter, base and collector.

For contacting the collector, a collector terminal region that is of the same conductivity as the collector, which has a higher doping than the collector, is arranged on the collector. A low-impedance contacting of the collector is thereby guaranteed.

It also lies within the scope of the invention and is a feature of a transistor constructed in accordance with the invention to arrange the collector as a further doped silicon structure on the surface of the substrate at that side of the base facing away from the emitter. Fast switching times are achieved by this laterally-disposed linear arrangement of emitter, base and collector.

It also lies within the scope of the invention and is a feature of a circuit arrangement constructed in accordance with the invention that the bipolar transistor is one transistor of a pair of simultaneously constructed bipolar transistors. In this case, the silicon layer grown on the substrate has two sidewalls that are independent of one another and each of which is respectively aligned parallel to the surface normal. A respective silicon structure is arranged at the sidewalls. The silicon layer thereby forms the common emitter for both bipolar transistors and the silicon structures each respectively form the base of the respective bipolar transistor. The two bipolar transistors are otherwise of identical structure. This circuit structure is particularly suitable for differential amplifiers. The common emitter that is formed of the silicon layer assures that the emitter areas of the two transistors are identical, this leading to the especially low offset voltage. This circuit structure is generally suitable for every circuit that contains emitter-coupled bipolar transistors.

The object of the invention is also achieved by a method of manufacturing a circuit structure that is characterized in that the silicon layer is deposited by a crystal growth method for generating the emitter.

According to a particular feature of the invention, a circuit structure having at least one bipolar transistor comprising an emitter of the bipolar transistor fashioned as a part of a doped silicon layer grown on a substrate and having a sidewall parallel to its surface normal, and a base of the bipolar transistor fashioned as a doped silicon structure that is arranged at the surface of the substrate and that covers the sidewall of the doped silicon layer, and is particularly characterized in that the doped silicon layer is deposited in a thickness between 50 and 500 nm.

According to another feature of the invention, the circuit arrangement is particularly characterized in that a first insulating layer is provided between the substrate and the doped silicon layer.

According to another feature of the invention, the circuit structure is particularly characterized in that a second insulating layer is provided on the doped silicon layer.

According to another feature of the invention, the circuit structure is particularly characterized in that the base terminal region is constructed as a region of a highly-conductive material that is arranged on the second insulating layer and is electrically connected to the silicon structure that forms the base.

According to another feature of the invention, the circuit structure is particularly characterized in that the base terminal region is composed of a metal silicide.

According to another feature of the invention, the circuit structure is particularly characterized in that the collector is arranged on the surface of the substrate at that side of the base that faces away from the emitter.

According to another feature of the invention, the circuit structure is particularly characterized in that a collector terminal region that is of the same conductivity type as the collector, but has a higher doping than the collector, and that is arranged on the collector.

According to another feature of the invention, the circuit structure is particularly characterized in that the bipolar transistor is provided as one of a pair of bipolar transistors, the doped silicon layer grown onto the substrate forms a common emitter for both bipolar transistors, the doped silicon layer comprises two mutually-independent sidewalls, each of which is respectively aligned parallel to the surface normal, the base of the respective bipolar transistor is respectively arranged at the sidewall, and that the two bipolar transistors are identically constructed.

According to a feature of the invention, the method of manufacturing the circuit structure by depositing a silicon layer by a crystal growth method for generating the emitter, the method is particularly characterized in that the doped silicon layer is structured such that it comprises sidewalls parallel to the surface normal, that a further silicon layer that covers the sidewall of the doped silicon layer is deposited and doped, so that it is of the opposite conductivity type compared to the doped silicon layer, and that, by anisotropic re-etching, the further silicon layer is removed down to a thickness of the sidewall covering that covers the sidewall, the resulting layer of sidewall covering forming the base of the bipolar transistor.

According to another feature of the invention, the method of manufacture is particularly characterized in that a first insulating layer is applied onto a silicon substrate, a doped silicon layer is grown onto the first insulating layer, a second insulating layer is applied onto the doped silicon layer, a conductive layer is grown onto the second insulating layer, a third insulating layer is applied onto the conductive layer, base terminal regions are defined by the first photo technique using masking and the third insulating layer and the conductive layer are produced by etching, that, after a second photo technique again using masking, the emitter region is produced by etching the second insulating layer, the doped silicon layer and the first insulating layer, that a doped silicon layer that is of the opposite conductivity type compared with the emitter region is deposited surface-wide onto the substrate, that the surface of the silicon substrate, of the third insulating layer and of the second insulating layer are exposed by anisotropic etching such that the outer sidewalls of the base terminal regions and of the emitter region remain covered by sidewall coverings that form the base regions, that the structure is covered surface-wide by a further doped silicon layer that is of the same conductivity type as the emitter region, that a highly-doped silicon layer that is of the same conductivity type as the doped silicon layer is deposited onto the doped silicon layer, that, after a third photo technique, again using masking, these new layers are structured by being etched away such that the collector region adjoining the base regions and collector terminal regions adjoining the collector regions arise, that the structure is provided with a passivation layer, and that holes to the collector terminal regions, to the base terminal regions and to the emitter region are opened in the passivation layer and are provided with metallizations.

According to another feature of the invention, the method is particularly characterized in that the doped silicon layer for the emitter region is produced by CVD silicon deposition to a thickness of 50-500nm and by subsequent implantation of $10^{16}$cm$^{-2}$ arsenic According to another feature of the invention, the method is particularly characterized in that the doped silicon layer for producing the base regions is produced as a silicon layer having a thickness of 10-100 nm that is subsequently doped by boron implantation.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a sectional view through a transistor constructed in accordance with the present invention;

FIG. 2 is a sectional view through a pair of transistors constructed in accordance with the present invention;

FIG. 3 is a schematic circuit diagram of a pair of transistors constructed in accordance with the present invention;

FIG. 4 is a fragmentary plan view showing the terminal configuration of a pair of transistors constructed in accordance with the present invention and relating to FIG. 2; and FIGS. 5-9 are sectional views illustrating the method of manufacture at or during different stages or steps of the manufacturing process.

DESCRIPTION OF THE PREFERRED EMBODIMENTS

Figure 8:
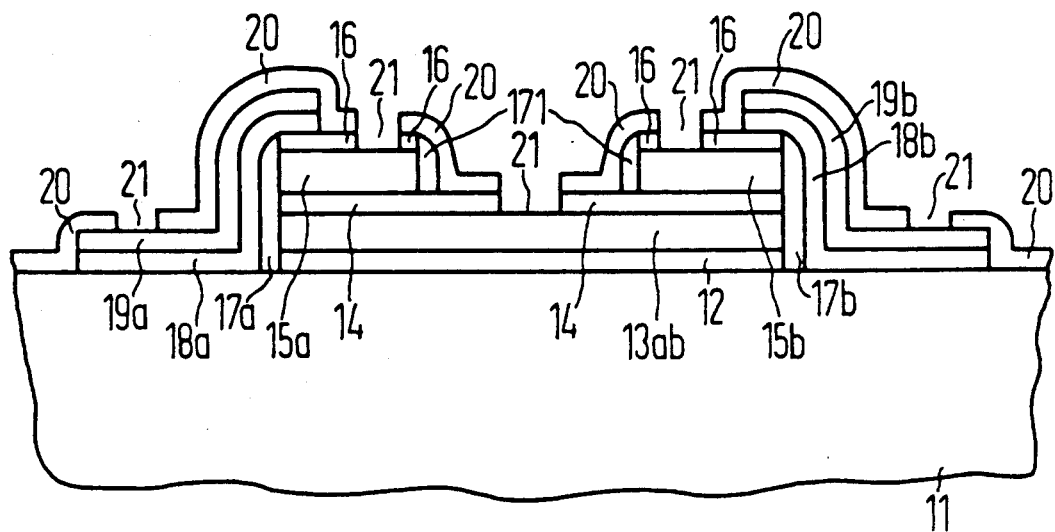

FIG. 1 illustrates a substrate 1 of silicon. A first insulating layer 2 is arranged on the substrate 1. For example, the first insulating layer 2 is composed of SiO$_2$ and is produced by chemical vapor deposition process (CVD) to a thickness of, for example, 10 nm. A doped silicon layer 3 is arranged on the first insulating layer 2. The doped silicon layer 3, for example, is doped with a n+dopant. The silicon layer 3 can be produced in various ways:

a) the silicon layer 3 is produced by deposition from the vapor phase onto the insulating layer 2 (polysilicon transistor);

b) the silicon layer 3 is produced by deposition from the vapor phase, whereby an expitaxial recrystallization of the layer is subsequently carried out. A contact window to the substrate 1 may thereby be potentially employed in order to have seeding zones available;

c) the silicon layer 3 is produced by lateral epitaxial growth from a seeding zone (lateral epitaxial overgrowth);

d) the silicon layer 3 can also be produced by what is referred to as the wafer bonding method that, for example, is known from Y. Arimoto, et al, 46th Device Research Conference, 1988, Boulder, Colo., pp. 1A-6; and e) for generating the silicon layer 3, moreover, all other so-called silicon-on-insulator (SOI) techniques may be employed that supply a monocrystalline silicon layer on an insulator, for example, SIMOX and FIPOS that are described, for example, in the article by J. Heisma, 18th ESSDERC, Conf. Proc., Journal de Physique, Cooloque C4, Supplement No. 9, p. C4-3.

Subsequently, the silicon layer 3 is implanted with $10^{16}$cm$^{-2}$ arsenic. For example, it has a thickness of between 50 and 500nm. A second insulation layer 4 is arranged on the doped silicon layer 3. The second insulation layer 4, for example, is composed of silicon oxide and is produced by the CVD method to a thickness of, for example, 100 nm. The first insulation layer 2, the doped silicon layer 3 and the second insulation layer 4 have a common sidewall 5 aligned perpendicular to the layer sequence. The sidewall 5 extends parallel to the surface normal of the doped silicon layer 3. The sidewall 5 is covered by a doped silicon structure 6. The doped silicon structure 6 is of conductivity type that is opposite that of the doped silicon layer 3, i.e., for example, is a p-doped layer. The doping of the doped silicon structure 6 occurs, for example, with boron. The doped silicon structure 6 has a thickness of about 10-100 nm. The doped silicon layer 3 forms the emitter of the bipolar transistor and the doped silicon structure 6 forms the base of the bipolar transistor. The doped silicon structure 6 is contacted by a conductive layer 7. The conductive layer 7 represents the terminal region for the doped silicon structure 6 that forms the base. The conductive layer 7 is composed, for example, of a highly-doped silicon layer having the same conductivity type as the doped silicon structure 6, but which has a higher conductivity, or is composed of a metal silicide. The conductive layer 7 has a thickness of, for example, 200nm.

Another doped silicon layer 8 is arranged at that surface of the doped silicon structure 6 facing away from the sidewall 5. It is of the same conductivity type as the doped silicon layer 3, i.e., for example, is an n-doped layer. The further doped silicon layer 8 forms the collector of the transistor. A terminal layer 9 is arranged on the further doped silicon layer 8. The terminal layer 9 is of the same conductivity type as the further doped silicon layer 8, but has a higher conductivity. All exposed regions of the transistor and of the substrate 1 are covered with a passivation layer 10 that, for example, is 100-200 nm thick and is composed of CVD oxide. Holes for contacting the emitter (not shown), the base and the collector are provided in the passivation layer 10. The holes are filled with metallizations of, for example, a selected one of PtSi/TiW/AlSiTi that form the emitter contact (not shown), the base contact B and the collector contact K. The emitter contact is arranged in a plane parallel to the illustrated section.

Referring to FIG. 2, two transistors constructed in accordance with the present invention are illustrated which, according to the present invention, form a transistor pair. The first insulating layer 2 of, for example, SiO$_2$ is arranged on the substrate 1. The doped silicon layer 3 is arranged on the first insulating layer 2. The second insulating layer 4 is arranged on the doped silicon layer 3. The doped silicon layer 3 forms the emitter for both transistors. The first insulating layer 2, the doped silicon layer 3 and the second insulating layer 4 have sidewalls 5a and 5b lying opposite one another. The sidewalls 5a, 5b are covered with doped silicon structures 6a, 6b. The doped silicon structures 6a, 6b each form the base of a respective transistor. The doped silicon structures 6a, 6b are contacted by conductive layers 7a, 7b that are arranged on the second insulating layer 4. The conductive layers 7a, 7b form the base terminal regions of the two transistors. Further doped silicon layers 8a, 8b that are of the same conductivity type as the doped silicon layer 3 are arranged at both surfaces of the doped silicon structures 6a, 6b facing away from the sidewalls 5a, 5b. The further doped silicon layers 8a, 8b form the collectors of the respective transistors. Terminal layers 9a, 9b are arranged on the further doped silicon layers 8a, 8b. The terminal layers 9a, 9b are of the same conductivity type as the further doped silicon layers 8a, 8b, but have a higher conductivity. The entire structure is covered with a passivation layer 10. Holes are provided with metallizations and are arranged in the passivation layer 2 for the base contacts Ba, Bb and for the collector contacts Ka, Kb of the respective transistor. The regions of the respective transistors Ta, Tb are indicated on the drawing with double-headed arrows. The individual transistors Ta, Tb are constructed in exactly the same manner as the transistor set forth with reference to FIG. 1. The common emitter of the transistor Ta, Tb is contacted via a common emitter contact that lies outside of the section shown in FIG. 2, but as can be seen as element E in FIG. 4.

FIG. 3 illustrates a circuit diagram for the pair of transistors set forth with reference to FIG. 2. Each of the two transistors has a respective base contact Ba, Bb and a respective collector contact Ka, Kb. However, they have only one emitter contact E.

FIG. 4 is a plan view of the structure illustrated in FIG. 2. The collector contacts Ka, Kb, the base contacts Ba, Bb and the common emitter contact E are arranged on the passivation layer 10. This contact arrangement is well-matched to terminal configurations as appear in emitter-coupled logic (ECL) or, respectively, current-mode logic (CML) circuits. The space requirements in the circuits can therefore be reduced with a pair of transistors constructed in accordance with the present invention. The line laying in the circuits is simplified.

A method for manufacturing transistors in accordance with the invention is set forth below.

The structure shown in FIG. 5 is produced as follows. A first insulating layer 12 is deposited onto a silicon substrate 11. The first insulating layer 12, for example, is 10nm thick; it is composed, for example, of $SiO_2$ and it is produced, for example, by thermal oxidation or by a CVD process.

A doped silicon layer 13 is subsequently produced on the first insulating layer 12 with the assistance of a crystal growth method. The deposited thickness of the doped silicon layer 13 can be precisely controlled to less than/equal to 1nm in a range of between 20nm and 500nm via the crystal growth. For example, the doped silicon layer 13 is deposited to a thickness of 200-500 nm with CVD silicon deposition. An implantation with, for example, $10^{16} cm^{-2}$ arsenic, follows the deposition. The doped silicon layer 13 is provided as a n+-doped layer as a result thereof.

A second insulating layer 14 is deposited onto the doped silicon layer 13. The second insulation layer 14, for example, is 100nm thick; it is composed, for example, of silicon oxide and is produced, for example, by a CVD process.

A conductive layer 15 is then applied onto the second insulating layer 14. For example, the conductive layer 15 is composed of 200nm thick CVD silicon that is p doped by implantation of boron.

A third insulator 16 of, for example, silicon dioxide having a thickness of, for example, 100 nm is generated on the conductive layer 15 by, for example, a CVD process.

After the manufacture of this multiple layer, the base terminal regions 15a, 15b are defined by a first phototechnique process (including masking for subsequent resistance to etching) and are produced by etching the third insulating layer 16 and the conductive layer 15.

Subsequently, the emitter regions 13ab is defined by a second phototechnique process (also including masking for resistance to subsequent etching) and is produced by the etching of the second insulating layer 14, of the doped silicon layer 13 and of the first insulating layer 12.

In the following step, the surface of the resulting structure is provided with a doped silicon layer that has the opposite conductivity compared to the doped silicon layer 13. This occurs either by deposition of an undoped silicon layer in a thickness of, for example, 10–100 nm and subsequent boron implantation or on the basis of p-doped deposition of the silicon layer. Outer sidewall coverings 17a, 17b at the outer sidewalls of the base terminal regions 15a, 15b and of the emitter region 13ab, as well as inner sidewall coverings 171 at the inner sidewalls of the base terminal regions 15a, 15b (see FIG. 6) are produced by subsequent, anisotropic re-etching of this layer. The outer sidewall coverings 17a, 17b form the base regions. The inner sidewall coverings 17a are manufactured-induced coverings and have no function.

Following thereupon, the resultant structure is provided surface-wide with a further doped silicon layer that is of the same conductivity type as the doped silicon layer 13. A second, further silicon layer is deposited thereon with the same conductivity type, but having a higher conductivity. For example, the two layers are both 100nm thick, the first being a n-doped layer and the second being a n+-doped layer. The collectors regions 18a, 18b are defined with a third phototechnique process and the collector regions 18a, 18b, as well as the collector terminal regions 19a, 19b are produced by etching the two layers (see FIG. 7).

The surface of the resultant structure is covered with a passivation layer 20. The passivation layer 20, for example, is 100–200nm thick and is composed of a CVD oxide. FIG. 8 illustrates the structure after holes 21 leading to the collector terminal regions 19a, 19b, to the base terminal regions 15a, 15b and to the emitter region 13ab have been provided.

Figure 9:
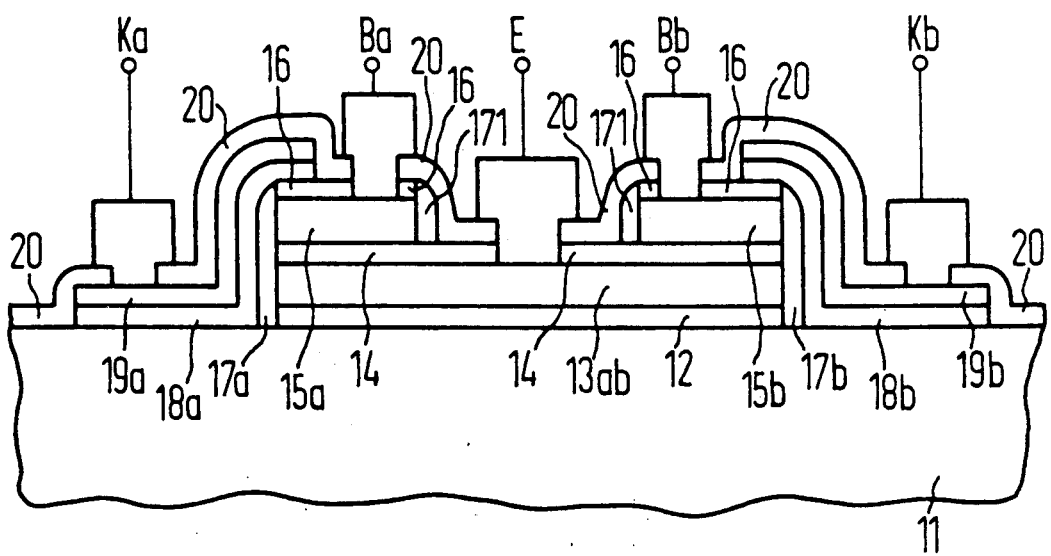

By filling the holes 21 with metallizations of, for example, a selected one of PtSi/TiW/AlSiTi, the bipolar transistor is provided with collector contacts Ka, Kb, with base contacts Ba, Bb and with a common emitter contact E and is finished (see FIG. 9).

The pair of lateral transistors is composed of two lateral bipolar transistors that are formed of the emitter region 13ab, the base region 17a, the collector region 18a and, respectively, the emitter region 13ab, the base region 17b and the collector region 18b. The effective emitter widths are defined by the contact areas of the emitter region 13ab with the base region 17a or, respectively, 17b. Since the emitter region 13ab was produced by crystal growth of the doped silicon layer, the emitter widths are defined by the layer thickness of the doped silicon layer 13. The layer thickness of the doped silicon layer 13 can be well controlled via the crystal growth as already set forth above.

The manufacture of a single bipolar transistor in accordance with the invention occurs in an analogous manner to the description set forth above for a pair of bipolar transistors.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit structure including at least one bipolar transistor which comprises a base, an emitter and a collector, said circuit structure comprising:
   a silicon substrate including a substrate surface;
   a first insulating layer disposed on a first portion of said substrate surface;
   an n+-doped silicon emitter layer disposed on said first insulating layer, and an emitter terminal disposed on said n+-doped silicon emitter layer, said emitter layer including a sidewall extending perpendicular to said substrate surface;
   a second insulating layer disposed on said n+-doped silicon emitter layer;
   a p-doped silicon base layer covering said sidewall of said n+-doped silicon emitter layer and extending perpendicular to said substrate surface, said base layer constituting the base of the at least one bipolar transistor;
   a highly-doped silicon base terminal layer disposed on a portion of said second insulating layer electrically contacting said p-doped silicon base layer and constituting a base terminal;
   an n-doped silicon collector layer disposed on a second portion of said substrate surface and constituting the collector of the at least one bipolar transistor;
   a collector terminal disposed on said further n-doped silicon collector layer;
   a passivation layer covering the at least one transistor and comprising a plurality of holes therethrough respectively extending to said collector terminal, said emitter terminal and said base terminal; and
   a plurality of electrical contacts each comprising metal filling the respective hole and in electrical contact with the area of the respective terminal exposed by the respective hole.

2. The circuit structure of claim 1, wherein said first insulating layer comprises:
   an oxide.

3. The circuit structure according to claim 1, wherein said first insulating layer comprises:
   a layer thickness of 10 mm.

4. The circuit structure of claim 1, wherein said first insulating layer comprises:
   an oxide including a layer thickness of 10 mm.

5. The circuit structure of claim 1, wherein said n+-doped silicon emitter layer comprises a thickness in the range of 20–500 mm.

6. The circuit structure of claim 1, wherein said n+-doped silicon emitter layer comprises:
   a doping concentration of $10^{16} cm^{-2}$ arsenic.

7. The circuit structure of claim 1, wherein said n+-doped silicon emitter layer comprises:
   a layer thickness in the range of 20–500 mm and includes a doping concentration of $10^{16} cm^{-2}$ arsenic.

8. The circuit structure of claim 1, wherein said second insulating layer comprises:
   a silicon oxide.

9. The circuit structure of claim 1, wherein:
   said second insulating layer comprises a thickness of 100 nm.

10. The circuit structure of claim 1, wherein said second insulating layer comprises:
    a layer of silicon oxide including a thickness of 100 nm.

11. The circuit structure of claim 1, wherein said p-doped silicon base layer comprises:
    a boron-doped layer.

12. The circuit structure of claim 1, wherein said p-doped silicon base layer comprises:
    a thickness in the range of 10–100nm.

13. The circuit structure of claim 1, wherein said p-doped silicon base layer comprises:
    boron-doped silicon including a layer thickness in the range of 10–100 nm.

14. The circuit structure of claim 1, wherein said highly-doped silicon base terminal layer comprises:
    the same conductivity as and of a higher doping concentration than that of said p-doped silicon base layer.

15. The circuit structure of claim 1, wherein said highly-doped silicon base terminal layer comprises:
    a thickness of 200 nm.

16. The circuit structure of claim 1, wherein said highly-doped silicon base terminal layer comprises:
    the same conductivity as and a higher doping concentration than that of said doped silicon base layer; and
    a layer thickness of 200 nm.

17. The circuit structure of claim 1, wherein said n-doped silicon collector layer comprises:
    a thickness of 100 nm.

18. The circuit structure of claim 1, wherein said collector terminal comprises:
    an n+-doped silicon layer.

19. The circuit structure of claim 1, wherein said collector terminal comprises:
    a layer including a thickness of 100 nm.

20. The circuit structure of claim 1, wherein said collector terminal comprises:
    an n+-doped silicon layer; and
    a layer thickness of 100 nm.

21. The circuit structure of claim 1, wherein:
    said metal filling the respective hole through said passivation layer comprises a metal selected from the group consisting of PtSi, TiW, and AlSiTi.

22. A circuit structure including at least one bipolar transistor which comprises a base, an emitter and a collector, said circuit structure comprising:
    a silicon substrate including a substrate surface;
    a first insulating layer disposed on a first portion of said substrate surface, said first insulating layer comprising an oxide and a layer thickness of 10 nm.
    an n+-doped silicon emitter layer disposed on said first insulating layer and forming the emitter of the at least one bipolar transistor, said emitter layer comprising a thickness in the range of 20–500 nm and a doping of $10^{16} cm^{-2}$ arsenic, said n+-doped silicon emitter layer including a sidewall extending perpendicular to said substrate surface;
    an emitter terminal disposed on said emitter layer;

a second insulating layer disposed on said n³⁰ doped silicon emitter layer and comprising silicon oxide and a thickness of 100 nm;

a p-doped silicon base layer covering said sidewall of said n⁺-doped silicon layer and extending perpendicular to said substrate surface, said base layer constituting the base of the at least one bipolar transistor and comprising boron doping and a thickness in the range of 10–100 nm;

a highly-doped silicon base terminal layer on a portion of said second insulating layer electrically contacting said p-doped silicon base layer and comprising the same conductivity as and a higher doping concentration than that of said doped silicon base layer and a thickness of 200 nm;

an n-doped silicon collector layer disposed on a second portion of said substrate surface constituting the collector of the at least one bipolar transistor and comprising a thickness of 100 nm;

an n⁺-doped silicon layer disposed on said n-doped silicon collector layer forming a collector terminal and comprising a thickness of 100 nm;

a passivation layer covering the at least one bipolar transistor and comprising a plurality of holes therethrough respectively extending to said collector terminal, said emitter terminal and said base terminal; and a plurality of electrical contacts each comprising metal filling a respective hole and in electrical contact with the area of the respective terminal exposed by the respective hole, said metal selected from a group consisting of PtSiTiW, and AlSiTi.

23. A circuit arrangement including at least one bipolar transistor which comprises a base, an emitter and a collector, said circuit arrangement comprising:

a silicon substrate including a substrate surface;

a first insulating layer disposed on a first portion of said substrate surface;

an n⁺-doped silicon emitter layer disposed on said first insulating layer and constituting an emitter of the at least one bipolar transistor, and an emitter terminal disposed on said n⁺-doped silicon emitter layer, said emitter layer and said first insulating layer each including a sidewall coplanar with the like sidewall of the other layer and extending perpendicular to said substrate surface;

a second insulating layer disposed on said n⁺-doped emitter layer and including a sidewall coplanar with said sidewalls of said first insulating layer and said emitter layer;

a p-doped silicon base layer covering said coplanar sidewalls of said n⁺-doped silicon emitter layer and said first and second insulating layers and extending perpendicular to said substrate surface, said base layer constituting the base of said at least one bipolar transistor;

a base terminal including a metal silicide layer on a portion of said second insulating layer electrically contacting said p-doped silicon base layer;

an n-doped silicon collector layer disposed on a second portion of said substrate and constituting the collector of said at least one bipolar transistor, said collector layer electrically contacting said base layer and spaced from said emitter layer by the thickness of said base layer;

a collector terminal disposed on said n-doped silicon collector layer;

a passivation layer covering the at least one bipolar transistor and comprising a plurality of holes therethrough respectively extending to said collector terminal, said emitter terminal and said base terminal; and a plurality of electrical contacts each comprising a metal filling a respective hole and in electrical contact with the area of the respective terminal exposed by the respective hole.

24. A circuit structure including at least one bipolar transistor comprising a base, an emitter and a collector, said circuit structure comprising:

a silicon substrate including a substrate surface;

a doped silicon emitter layer disposed on said substrate insulated from said substrate surface, said doped silicon emitter layer constituting the emitter of the bipolar transistor and including a sidewall extending perpendicular to said substrate surface;

a first insulating layer disposed on said substrate surface and supporting said doped silicon emitter layer;

a second insulating layer disposed on said doped silicon emitter layer;

said first and second insulating layer each comprising a sidewall coplanar with said sidewall of said emitter layer;

a doped silicon base layer extending perpendicular to said substrate surface and covering said coplanar sidewalls, said base layer forming the base of the at least one bipolar transistor;

a base terminal comprising a metal silicide contacting said doped silicon base layer and disposed on said second insulating layer, said base terminal including an edge extending over said second insulating layer and electrically contacting said doped silicon base layer; and a doped silicon collector layer disposed on said surface of said substrate on the side of said base layer which faces away from said emitter layer and spaced from said emitter sidewall by and electrically contacting said base layer.

25. The circuit structure of claim 24, wherein:

said doped silicon emitter layer comprises a thickness in the range of 50-500 nm.

26. The circuit structure of claim 24, and further comprising:

a collector terminal including a doped semiconductor layer of the same conductivity type as said doped collector layer and of a higher doping concentration than that of said collector layer disposed on said doped collector layer.

* * * * *